United States Patent
Kim

[19]

[11] Patent Number: 5,854,513
[45] Date of Patent: Dec. 29, 1998

[54] SEMICONDUCTOR DEVICE HAVING A BUMP STRUCTURE AND TEST ELECTRODE

[75] Inventor: Seong Jin Kim, Namchaeju-kun, Rep. of Korea

[73] Assignee: LG Electronics Inc., Seoul, Rep. of Korea

[21] Appl. No.: 679,074

[22] Filed: Jul. 12, 1996

[30] Foreign Application Priority Data

Jul. 14, 1995 [KR] Rep. of Korea ................. 1995-20848

[51] Int. Cl.$^6$ ............. H01L 29/50; H01L 29/78; H01L 23/54
[52] U.S. Cl. ............. 257/737; 257/738; 257/781; 257/766; 257/764; 257/763; 257/786; 257/734
[58] Field of Search ..................... 257/737, 738, 257/734, 735, 758, 764, 766, 763, 700, 698, 690, 673, 781, 778, 784, 786

[56] References Cited

U.S. PATENT DOCUMENTS

| | | | |
|---|---|---|---|
| 3,942,187 | 3/1976 | Gelsing et al. ........................... | 257/737 |
| 4,434,434 | 2/1984 | Bhattacharya et al. ................. | 257/766 |
| 5,046,161 | 9/1991 | Takada .................................... | 257/778 |
| 5,349,239 | 9/1994 | Sata ......................................... | 257/737 |
| 5,554,887 | 9/1996 | Sawai et al. ............................. | 257/778 |
| 5,629,564 | 5/1997 | Nye, III et al. ......................... | 257/763 |
| 5,631,499 | 5/1997 | Hosomi et al. ......................... | 257/738 |
| 5,665,639 | 9/1997 | Seppala et al. ........................... | 438/15 |

FOREIGN PATENT DOCUMENTS

| | | | |
|---|---|---|---|
| 54-14672 | 2/1979 | Japan ...................................... | 257/737 |
| 60-124847 | 7/1985 | Japan ...................................... | 257/737 |
| 61-134063 | 6/1986 | Japan ...................................... | 257/737 |
| 1-128546 | 5/1989 | Japan ...................................... | 257/737 |
| 5-166814 | 7/1993 | Japan . | |
| 5-243319 | 9/1993 | Japan ...................................... | 257/737 |
| 5-347340 | 12/1993 | Japan ...................................... | 257/737 |

*Primary Examiner*—Tom Thomas
*Assistant Examiner*—Alexander Oscar Williams
*Attorney, Agent, or Firm*—Morgan, Lewis & Bockius LLP

[57] ABSTRACT

A bump structure of a semiconductor device includes at least one pad electrode formed on a semiconductor substrate; a test electrode formed on the semiconductor substrate, the pad electrode and the test electrode being located separately from one another; a passivation layer formed on an area of the semiconductor substrate other than that covered by the pad electrode and the test electrode; a metal layer integrally formed on a portion of the pad electrode and on a portion of the test electrode adjacent to the pad electrode; and a bump formed on an overall surface of the metal layer.

21 Claims, 4 Drawing Sheets

SEMICONDUCTOR DEVICE HAVING A BUMP STRUCTURE AND TEST ELECTRODE

BACKGROUND OF THE INVENTION

1. Field of the Invention

The present invention relates to a semiconductor device, and more particularly, to a bump structure of a semiconductor device and the forming method.

2. Discussion of the Related Art

Generally, since the development of large-scale integration (LSI), with the tendency to make electronic apparatus more compact, lighter, and multi-functional, techniques for mounting a device having a pin or pitch, for compacting its module, and for achieving thermo-stability and low cost, have been required in order to perform electrical connection with respect to an external terminal (e.g., after the development of LSI).

As for this mounting method, there are three types: first, a wire bonding (WB) method, which is used to connect an LSI chip to an external terminal with an Au wire or Al wire, the wire serving to fix the LSI chip in the wire-connection region; second, a tape automated bonding (TAB) method of forming a bump on an electrode of an LSI chip, first connecting it to a lead film and then connecting it to an external terminal; and third, a chip on glass (COG) method in which the LSI chip is positioned face down to be connected to a circuit board. In COG, a bump is mounted on a bare chip to take its connection area as an area of the LSI chip, thereby enabling the chip to be mounted with a high concentration.

Among these mounting methods, the COG method is widely used because its connection area is taken as the chip area. For this reason, the method is advantageous for making multiple pins, for reducing the length resistance and inductance of the connection wire, for enhancing the speed of signal transmission, and for reducing noise.

With reference to the attached drawings, a structure of a conventional bump of a semiconductor device and a fabrication method are described as follows.

FIG. 1 is a sectional view illustrating a conventional bump structure for bonding a flip chip. FIGS. 2A to 2E are sectional views illustrating a manufacturing procedure of a conventional bump.

As illustrated in FIG. 1, the conventional bump structure includes a chip pad 2 formed on a specific portion of semiconductor substrate 1, a passivation layer 3 formed on specific portions on both sides of the chip pad 2 and on the overall surface of the semiconductor substrate 1, a base metal layer 4 formed on the specific portions of the passivation layer 3 and on the overall surface of the chip pad 2 where it is exposed through the passivation layer 3, and a bump 6 formed on the overall surface of the base metal layer 4.

As illustrated in FIG. 2A, the conventional bump structure is formed as follows. The semiconductor 1 having the chip pad 2 thereon is prepared. The passivation layer 3 is formed on the overall surface of the chip pad 2. A photoresist layer (not shown) is coated on the overall surface of passivation layer 3. The photoresist layer is removed to expose the passivation layer 3 on a specific portion on the chip pad 2. Ti/W material is deposited on the overall surface of the substrate by a sputtering step to form the base metal layer 4.

As illustrated in FIG. 2B, a photoresist layer 5 is coated on the overall surface of the base metal layer 4. Then the photoresist layer 5 is selectively removed at the location where a bump will be formed in the following step.

As illustrated in FIG. 2C, the bump 6 is formed on the area of the base metal layer 4 where the photoresist layer 5 is removed by plating Au via an electroplating method. The base metal layer 4 can be used as the plating electrode.

As illustrated in FIG. 2D, the unnecessary photoresist layer is removed from around the Au bump 6.

As illustrated in FIG. 2E, all of the base metal layer 4, except for the portion beneath the Au bump 6, is removed by an etching step, using the Au bump 6 as a mask.

The conventional bump structure of a semiconductor device and the fabrication method thereof are problematic, however, in that the surface of the bump may be damaged by the ending point of a probe, for example, when specifically probing for an electrical die sorting (EDS) test, and therefore a low quality bump may be produced. In addition, the yield is decreased during the chip bonding step due to the aforementioned reasons. This impedes accurate testing, and thereby increases the rate of poor products.

SUMMARY OF THE INVENTION

Accordingly, the present invention is directed to a bump structure of a semiconductor device that substantially alleviates one or more of the problems due to limitations and disadvantages of the related art.

An object of the invention is to provide a bump structure of a semiconductor device, and its fabrication method, that are suitable to prevent decreases in testing reliability caused by damages on the surface of the bump and polluting material thereby enhancing its yield with respect to bonding.

Additional features and advantages of the invention will be set forth in the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a bump structure of a semiconductor device includes at least one pad electrode formed on a semiconductor substrate; a test electrode formed on the semiconductor substrate, the pad electrode on the test electrode being located separately from one another; a passivation layer formed on an area of the semiconductor substrate other than that covered by the pad electrode and the test electrode; a metal layer integrally formed on a portion of the pad electrode and on a portion of the test electrode adjacent to the pad electrode; and a bump formed on an overall surface of the metal layer.

In another aspect, the present invention provides a method of forming a bump structure of a semiconductor device, the method comprising the steps of: (1) forming a pad electrode and a corresponding test electrode responding on a semiconductor substrate; (2) depositing a passivation layer on an overall surface of the semiconductor substrate, the pad electrode and the test electrode; (3) coating a first photoresist layer on the overall surface of the substrate and then patterning the first photoresist layer to remove the passivation layer from specific portions of the pad electrode and the test electrode; (4) removing the first photoresist layer, and then integrally forming a base metal layer on a portion of the pad electrode and on a portion of the test electrode adjacent to the pad electrode; (5) coating a second photoresist layer on the overall surface of the substrate, and then patterning and selectively removing portions of the second photoresist layer for the purpose of forming a bump on an overall surface of the metal layer; (6) forming a bump having a constant height on the overall surface of said metal layer by using the second photoresist layer as a mask, and thereafter removing the second photoresist layer; and (7) completely removing the base metal layer except for a portion of the base metal layer located below the bump, to expose a surface of the test electrode.

In another aspect, the present invention provides a bump structure of a semiconductor device, the bump structure comprising: a pad electrode formed on a semiconductor substrate; a test electrode formed on the semiconductor substrate, the pad electrode and the test electrode being located separate from one another; a passivation layer formed over the semiconductor substrate, at least a portion of the passivation layer being formed on an area of the semiconductor substrate other than that covered by the pad electrode and the test electrode; and a bump formed over the semiconductor substrate in electrically conductive contact with the pad electrode and the test electrode.

In a further aspect, a method of manufacturing a bump structure of a semiconductor device, the method comprising the steps of: (1) forming a pad electrode and a test electrode separate from one another on a semiconductor substrate; (2) forming a passivation layer on at least a portion of each of the semiconductor substrate, the pad electrode, and the test electrode; (3) forming a conductive bump over at least a portion of each of the pad electrode, the test electrode, and the passivation layer, such that the bump is in electrically conductive contact with the pad electrode and the test electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

In the drawings.

DETAILED DESCRIPTION OF THE PREFERRED EMBODIMENTS

Reference will now be made in detail to the preferred embodiments of a bump structure of a semiconductor device and the fabrication method thereof in accordance with the present invention, examples of which are illustrated in the accompanying drawings.

Figure 1:
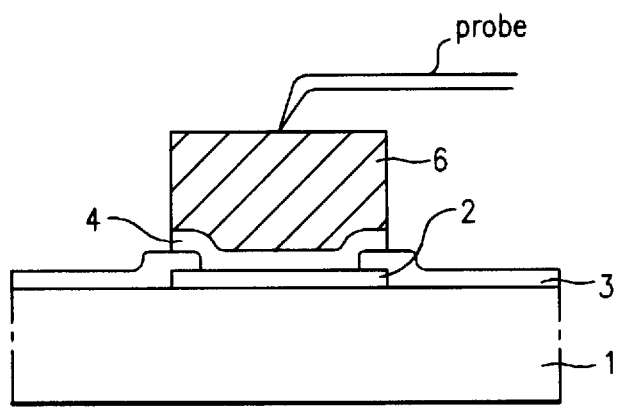
FIG. 1 is a sectional view of a conventional bump structure.
Figure 2A:
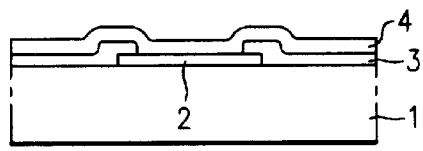
FIGS. 2A to 2E are sectional views illustrating a manufacturing procedure of a conventional bump structure.
Figure 2B:
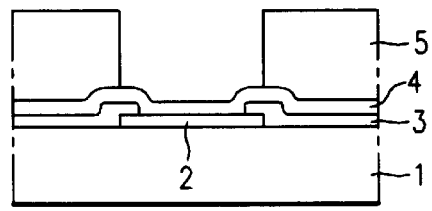
Figure 2C:
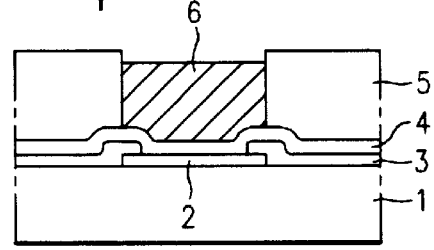
Figure 2D:
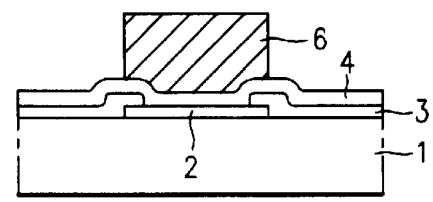
Figure 2E:
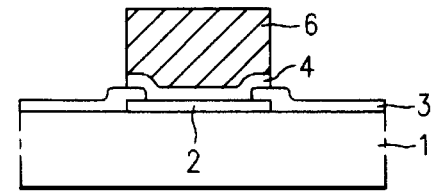
Figure 3:
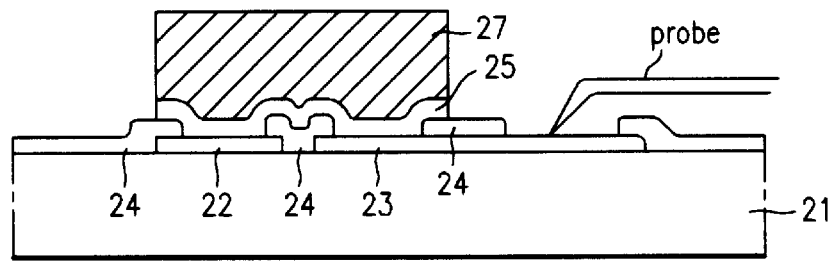
FIG. 3 is a sectional view illustrating a bump structure according to a first embodiment of the invention.

As illustrated in FIG. 3, a bump structure in accordance with the present invention includes: a pad electrode 22 and test electrode 23 formed on a specific portion of a semiconductor substrate 21; a passivation layer 24 made of three separated parts, one part formed on one side of the pad electrode 22, another part formed on an exposed portion between the pad electrode 22 and test electrode 23, and still another part formed on a predetermined central portion of the test electrode 23; a base metal layer 25 covering an area extending from a specific portion of the first passivation layer part to a portion of the third passivation layer part; and a bump formed on the overall surface of the base metal layer 25.

A method for forming a bump structure in accordance with the present invention is as follows.

Figure 4A:
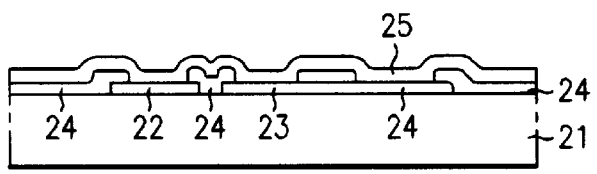
FIGS. 4A to 4D are sectional views illustrating the manufacturing procedure of the bump structure according to the first embodiment of the invention.

As illustrated in FIG. 4A, the pad electrode 22 and the test electrode 23 are formed separately on the semiconductor substrate 21. The passivation layer 24 is formed on the overall surface of the substrate 21 to protect the surface of the device. A first photoresist layer (not shown) is formed on the overall surface of the passivation layer 24. The passivation layer on the parts excluding a center portion of the test electrode 23 and on the pad electrode 22 are removed using the photoresist layer during an exposure and photo-developing process. Ti/W material is deposited on the overall surface of the passivation layer, including the pad electrode 22 where the passivation layer is removed and the test electrode 23, by a sputtering process to form a base metal layer 25 (for instance, Cr/Cu).

Figure 4B:
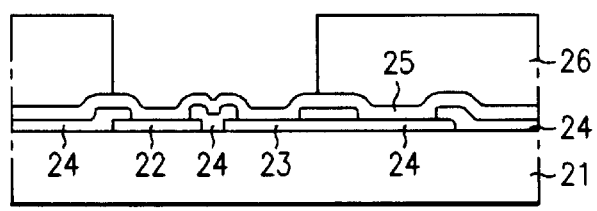

As illustrated in FIG. 4B, a photoresist layer 26 is deposited on the overall surface of the base metal layer 25 and selectively removed by an exposure and photo-developing process so as to form a bump in a subsequent manufacturing step.

Figure 4C:
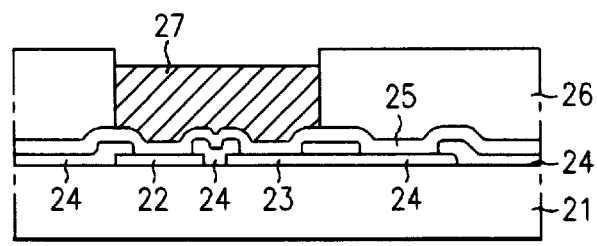

As illustrated in FIG. 4C, metal such as Pb/Sn (or Ln alloy, Ni, Cu) is plated on the portion where the photoresist layer 26 is removed by an electroplating method. Then the bump 27 is formed at that location. In the case where a vertical bump is to be formed, the photoresist layer is formed to be higher than the bump.

Figure 4D:
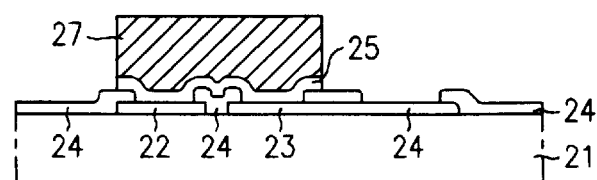

As illustrated in FIG. 4D, the remainder of photoresist layer 26 is removed and then the base metal 25, except for the portion below the bump 27, is removed using the bump 27 as a mask, to thereby complete the bump forming process.

Figure 5:
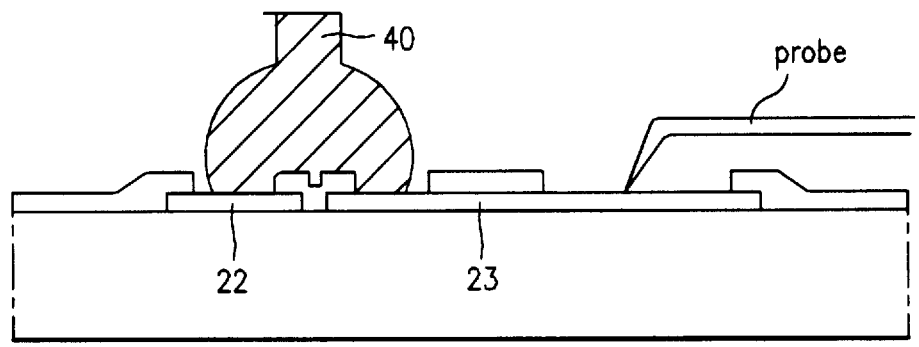
FIG. 5 is a sectional view illustrating a bump structure according to a second embodiment of the invention.

In a second embodiment of the present invention illustrated in FIG. 5, a two-step stud bump 40 is formed on the pad and test electrodes 22 and 23 (these electrodes are not electrically connected with each other) through a bonding wire method to electrically connect the pad and test electrodes 22 and 23 with each other. Then an IC functional test is performed using the test electrode 23.

Figure 6:
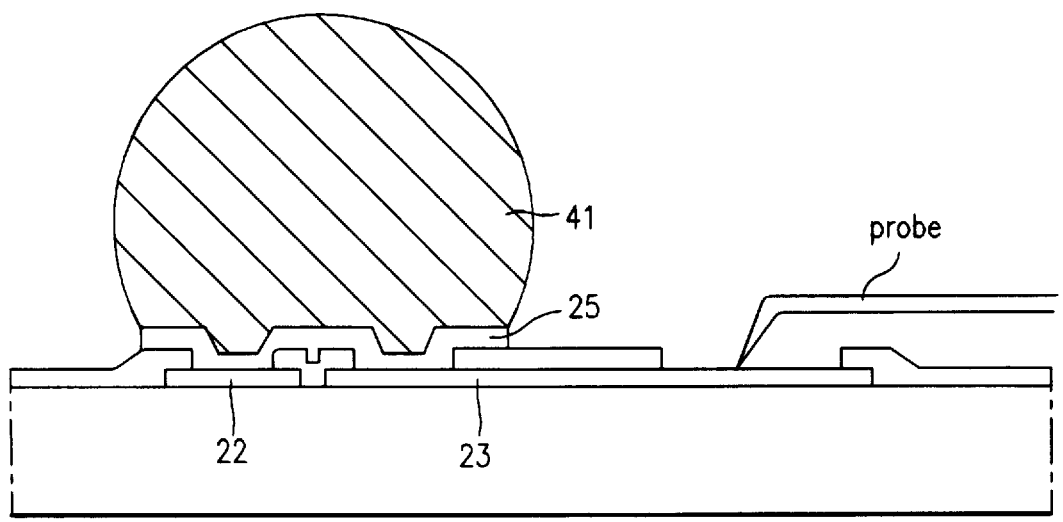
FIG. 6 is a sectional view illustrating a bump structure according to a third embodiment of the invention.

In the third embodiment of the invention illustrated in FIG. 6, the pad electrode 22 and the test electrode 23 are electrically connected by a base metal layer 25. A solder bump 41 is formed on the overall surface of the base metal 25, and then an IC functional test is performed using the test electrode 23.

As described above, the bump structure of a semiconductor device and its fabrication method of the present invention are performed in such a manner that a pad is bisected; the bisected pads are electrically connected with each other by the base metal layer; and the outer portion of the two bisected pads is used for test purposes. This prevents the deterioration of reliability which can result from damage to the bump surface and polluting material. As a result, the invention has an effect of enhancing yield when a chip bonding process is carried out.

Accordingly, the present invention provides a bump structure of a semiconductor device, and its fabrication method that is suitable for accurately performing an test operation of a chip, such as a bare chip having a bump, for reducing its cost and for enhancing its yield with respect to bonding. Thus, the bump structure of the present invention prevents decreases in test reliability caused by damages on the surface of the bump and polluting materials by bisecting the chip pad and testing the outer pad portion to enhance the yield with respect to bonding.

It will be apparent to those skilled in the art that various modifications and variations can be made in the bump structure of semiconductor device and method for forming the same of the present invention without departing from the spirit or scope of the invention. Thus, it is intended that the present invention cover the modifications and variations of this invention provided they come within the scope of the appended claims and their equivalents.

What is claimed is:

1. A bump structure of a semiconductor device, the bump structure comprising:

at least one pad electrode on a semiconductor substrate;

a test electrode on the semiconductor substrate, the pad electrode and the test electrode being located separately from one another;

a passivation layer on an area of the semiconductor substrate other than that covered by the pad electrode and the test electrode;

a base metal layer formed on a portion of the pad electrode and on a portion of the test electrode adjacent to the pad electrode, the remaining portion of the test electrode extending beyond the base metal layer so as to be accessible by a test probe; and a bump on an overall surface of the base metal layer.

2. The bump structure of a semiconductor device as claimed in claim 1, wherein the bump includes a material selected from a group including Pb/Sn, Ln alloy, Ni, Cu and Au.

3. The bump structure of a semiconductor device as claimed in claim 1, wherein Ti/W material is included in the base metal layer that is formed on the area of the semiconductor substrate.

4. The bump structure of a semiconductor device as claimed in claim 1, wherein the base metal layer includes Cr/Cu.

5. The bump structure of a semiconductor device as claimed in claim 1, wherein the bump includes a solder bump on the base metal layer.

6. A bump structure of a semiconductor device, the bump structure comprising:

a pad electrode on a semiconductor substrate;

a test electrode on the semiconductor substrate, the pad electrode and the test electrode being located separate from one another;

a passivation layer over the semiconductor substrate, at least a portion of the passivation layer being on an area of the semiconductor substrate other than that covered by the pad electrode and the test electrode; and a bump over the semiconductor substrate in electrically conductive contact with the pad electrode and the test electrode, wherein the test electrode comprises a first portion located adjacent the bump and a second portion configured to allow contact between the second portion and a test probe.

7. The bump structure of a semiconductor device as claimed in claim 6, further comprising a metal layer on at least a portion of the pad electrode and on at least a portion of the test electrode, the metal layer providing an electrically conductive path between the bump and the pad and test electrodes.

8. The bump structure of a semiconductor device as claimed in claim 6, wherein the second portion of the test electrode lies exposed on a surface of the semiconductor substrate.

9. The bump structure of a semiconductor device as claimed in claim 6, wherein the bump includes a double-step stud bump on at least a portion of each of the pad electrode and test electrode.

10. The bump structure of a semiconductor device as claimed in claim 7, wherein the bump includes a solder bump on the metal layer.

11. A bump structure of a semiconductor device, the bump structure comprising:

at least one pad electrode on a semiconductor substrate;

a test electrode on the semiconductor substrate, the pad electrode and the test electrode being located separately from one another;

a passivation layer on an area of the semiconductor substrate other than that covered by the pad electrode and the test electrode;

a base metal layer integrally formed on a portion of the pad electrode and on a portion of the test electrode adjacent to the pad electrode; and a bump on an overall surface of the metal layer, wherein the test electrode comprises a first portion located adjacent the bump and a second portion configured to allow contact between the second portion and a test probe.

12. The bump structure of a semiconductor device as claimed in claim 11, wherein the bump includes a material selected from a group including Pb/Sn, Ln alloy, Ni, Cu and Au.

13. The bump structure of a semiconductor device as claimed in claim 11, wherein Ti/W material is included in the base metal layer that is formed on the area of the semiconductor substrate.

14. The bump structure of a semiconductor device as claimed in claim 11, wherein the base metal layer includes Cr/Cu.

15. The bump structure of a semiconductor device as claimed in claim 11, wherein the bump includes a solder bump on the base metal layer.

16. The bump structure of a semiconductor device as claimed in claim 11, wherein the second portion of the test electrode lies exposed on a surface of the semiconductor substrate.

17. A bump structure of a semiconductor device comprising:

a substrate;

a pad electrode on the substrate;

a test electrode on the substrate adjacent the pad electrode;

a passivation layer covering the substrate, the pad electrode and the test electrode, the passivation layer having a first hole over the pad electrode, a second hole over the test electrode, and a third hole over the test electrode;

a base metal layer in the first hole over the pad electrode and the second hole over the test electrode, and the base metal layer on the passivation layer between the pad electrode and the test electrode; and a bump on the base metal layer.

18. The bump structure of a semiconductor device as claimed in claim 17, wherein the bump includes a material selected from a group including Pb/Sn, Ln alloy, Ni, Cu and Au.

19. The bump structure of a semiconductor device as claimed in claim 17, wherein the base metal layer includes Ti/W material.

20. The bump structure of a semiconductor device as claimed in claim 17, wherein the base metal layer includes Cr/Cu.

21. The bump structure of a semiconductor device as claimed in claim 17, wherein the bump includes a solder bump.

* * * * *